(12) United States Patent  (10) Patent No.: US 9,356,224 B2
Zeches et al.  (45) Date of Patent: May 31, 2016

(54) THIN FILM BISMUTH IRON OXIDES USEFUL FOR PIEZOELECTRIC DEVICES

(75) Inventors: Robert J. Zeches, San Francisco, CA (US); Lane W. Martin, Champaign, IL (US); Ramamoorthy Ramesh, Moraga, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 12/916,209

(22) Filed: Oct. 29, 2010

(65) Prior Publication Data

US 2011/0133601 A1 Jun. 9, 2011

Related U.S. Application Data

(60) Provisional application No. 61/256,897, filed on Oct. 30, 2009.

(51) Int. Cl.
    H01L 41/187 (2006.01)
    H01L 41/08 (2006.01)
    H03H 9/02 (2006.01)
    H01L 41/316 (2013.01)

(52) U.S. Cl.
    CPC .......... *H01L 41/081* (2013.01); *H01L 41/1878* (2013.01); *H01L 41/316* (2013.01); *H03H 9/02543* (2013.01)

(58) Field of Classification Search
    CPC ....................................................... H01B 3/12
    USPC ............. 310/358; 252/62.9 PZ, 62.9 R, 62.9; 501/134
    See application file for complete search history.

(56) References Cited

U.S. PATENT DOCUMENTS

| | | | |
|---|---|---|---|
| 7,928,637 B2 * | 4/2011 | Comyn et al. | 310/358 |
| 2008/0089832 A1 * | 4/2008 | Aoki et al. | 423/608 |
| 2008/0237531 A1 * | 10/2008 | Tsukada et al. | 252/62.9 PZ |
| 2009/0051245 A1 * | 2/2009 | Takayama et al. | 310/313 R |
| 2009/0112957 A1 * | 4/2009 | Abramovitch et al. | 708/313 |
| 2009/0243438 A1 * | 10/2009 | Hamada et al. | 310/358 |

(Continued)

FOREIGN PATENT DOCUMENTS

| | | | | |
|---|---|---|---|---|
| JP | 2006-176366 | * | 7/2006 | .............. C04B 35/00 |
| JP | 2007-221066 A | * | 8/2007 | .......... H01L 21/8246 |

(Continued)

OTHER PUBLICATIONS

S.E.Park, T.R. Shrout, "Ultrahigh strain and piezoelectric behavior in relaxor based ferroelectric single crystals", J. Appl. Phys, 1997, 82, 1804-1811.

(Continued)

*Primary Examiner* — Thomas Dougherty
(74) *Attorney, Agent, or Firm* — Robin C. Chiang; Lawrence Berkeley National Laboratory

(57) ABSTRACT

The present invention provides for a composition comprising a thin film of $BiFeO_3$ having a thickness ranging from 20 nm to 300 nm, a first electrode in contact with the $BiFeO_3$ thin film, and a second electrode in contact with the $BiFeO_3$ thin film; wherein the first and second electrodes are in electrical communication. The composition is free or essentially free of lead (Pb). The BFO thin film is has the piezoelectric property of changing its volume and/or shape when an electric field is applied to the BFO thin film.

26 Claims, 10 Drawing Sheets

(56) References Cited

U.S. PATENT DOCUMENTS

| | | | | |
|---|---|---|---|---|
| 2010/0208412 | A1* | 8/2010 | Takashima et al. | 361/322 |
| 2011/0221302 | A1* | 9/2011 | Yabuta et al. | 310/311 |
| 2012/0119623 | A1* | 5/2012 | Takeuchi et al. | 310/339 |
| 2012/0319533 | A1* | 12/2012 | Kubota et al. | 310/357 |

FOREIGN PATENT DOCUMENTS

| | | | | |
|---|---|---|---|---|
| JP | 2007-287739 A | * | 11/2007 | H01L 41/09 |
| JP | 2008-274368 A | * | 11/2008 | C23C 14/08 |
| JP | 2010-007121 A | * | 1/2010 | C23C 14/08 |
| WO | WO-2008-114148 A1 | * | 7/2010 | C04B 35/26 |

OTHER PUBLICATIONS

R. Guo et al, "Origin of the High Piezoelectric Response in PbZr1-xTixO3", Physical Review Letters, 2000, 84, 5423-5426.

H. Fu and R. Cohen, "Polarization rotation mechanism for ultrahigh electromechanical response in single-crystal piezoelectrics", Nature, 2000, 403, 281-283.

M. Ahart et al., Origin of morphotropic phase boundaries in ferroelectrics, Nature, 2008, 451, 545-549.

W. Eerenstein et al, "Multiferroic and magnetoelectric materials", Nature, 2006, 442, 759-765.

R. Ramesh and N. Spaldin, "Multiferroics: progress and prospects in thin films", Nature Materials, 2007, 6, 21-29.

C. Ederer and N. Spaldin, "Effect of Epitaxial Strain on the Spontaneous Polarization of Thin Films Ferroelectrics", Phys. Rev. Lett., 2005, 95, 257601.

R. Ravindran et al, "Theoretical investigation of magnetoelectric behavior in BiFeO3", Phys. Rev., 2006, 74, 224412.

D. Ricinschi et al, "A mechanism for the 150 mC cm-2 polarization of BiFeO3 films based on first-principles calculations and new structural data", J. Phys. Condens. Matter, 2006, 18, L97-L105.

H. Bea et. al., "Evidence for Room-Temperature Multiferroicity in a Compound with a Giant Axial Ratio", Phy. Rev. Lett., 2009, 102, 217603.

D. Schlom et al, "Strain Tuning of Ferroelectric Thin Films", Annu. Rev. Mater. Res., 2007, 37, 589-626.

F. Zavaliche et al, "Multiferroic BiFeO3 films: domain structure and polarization dynamics", Phase Transit., 2006, 79, 991-1017.

G. Xu et al, "Low symmetry phase in (001) BiFeO3 epitaxial contrained thin films", App. Phys. Lett., 2005, 86, 182905.

Y. H. Chu et al, "Ferroelectric size effects in multiferroic BiFeO3 thin films", App. Phys. Lett., 2007, 90, 252906.

H. Bea et al, "Investigation on the origin of the magnetic moment of BiFeO3 thin films by advanced x-ray characterizations", Phys. Rev., 2006, 74, 020101.

K. Y. Yun et al, "Structural and multiferroic properties of BiFeO3 thin films at room temperature", J. Appl. Phys., 2004, 96, 3399-3403.

G. Kresse and J. Furthmuller, "Efficient iterative schemes for ab initio total-energy calculations using a plane-wave basis set", Phys. Rev B, 1996, 54, 11169-11186.

V. Anisimov et al, First-principles calculations of the electronic structure and spectra of strongly correlated systems: the LDA+U method, J. Phys. Condes. Matter, 1997, 9, 767-808.

A. Christy, "Isosymmetric Structural Phase Transitions: Phenomenology and Examples", Acta Cryst., 1995, B51, 753-757.

R. Shpanchenko et al, "Sysntheis, Structure, and Properties of New Perovskite PbVO3", Chem. Mater, 2004, 16, 3267-3273.

A. Belik et al., "Neutron Powder Diffraction Study on the Crystal and Magnetic Structures of BiCoO3", Chem. Mater., 2006-18, 798-803.

M. Chisholm et al., "Simultaneous Z-Contrast and Phase Contrast Imaging of Oxygen in Ceramic Interfaces", Microsc Microanal 10 (Suppl 2), 2004, 256-257.

* cited by examiner

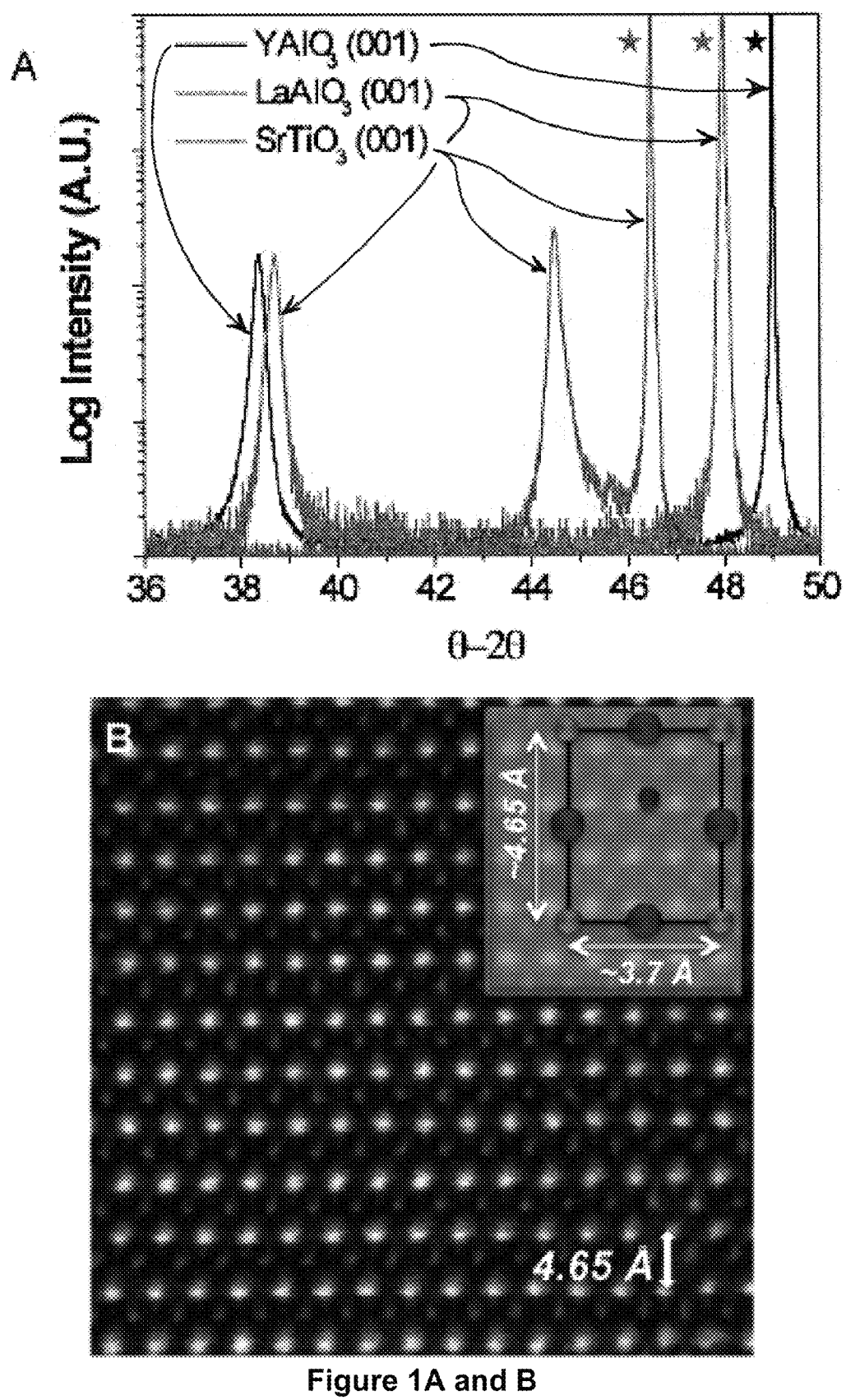
Figure 1A and B

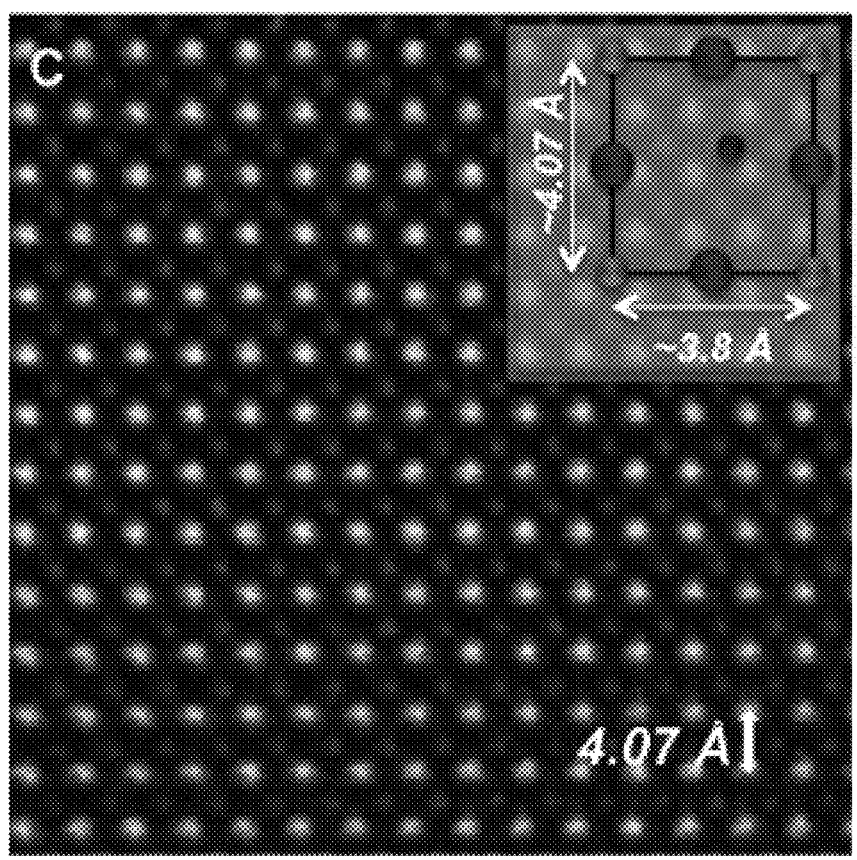
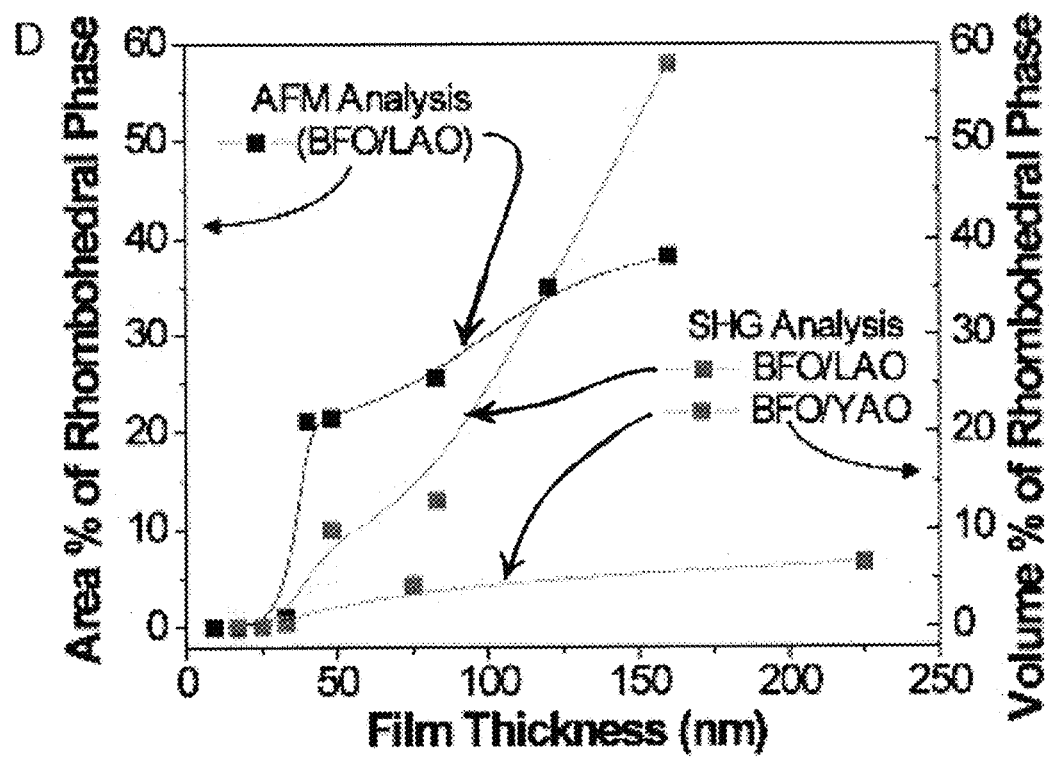
Figure 1C and D

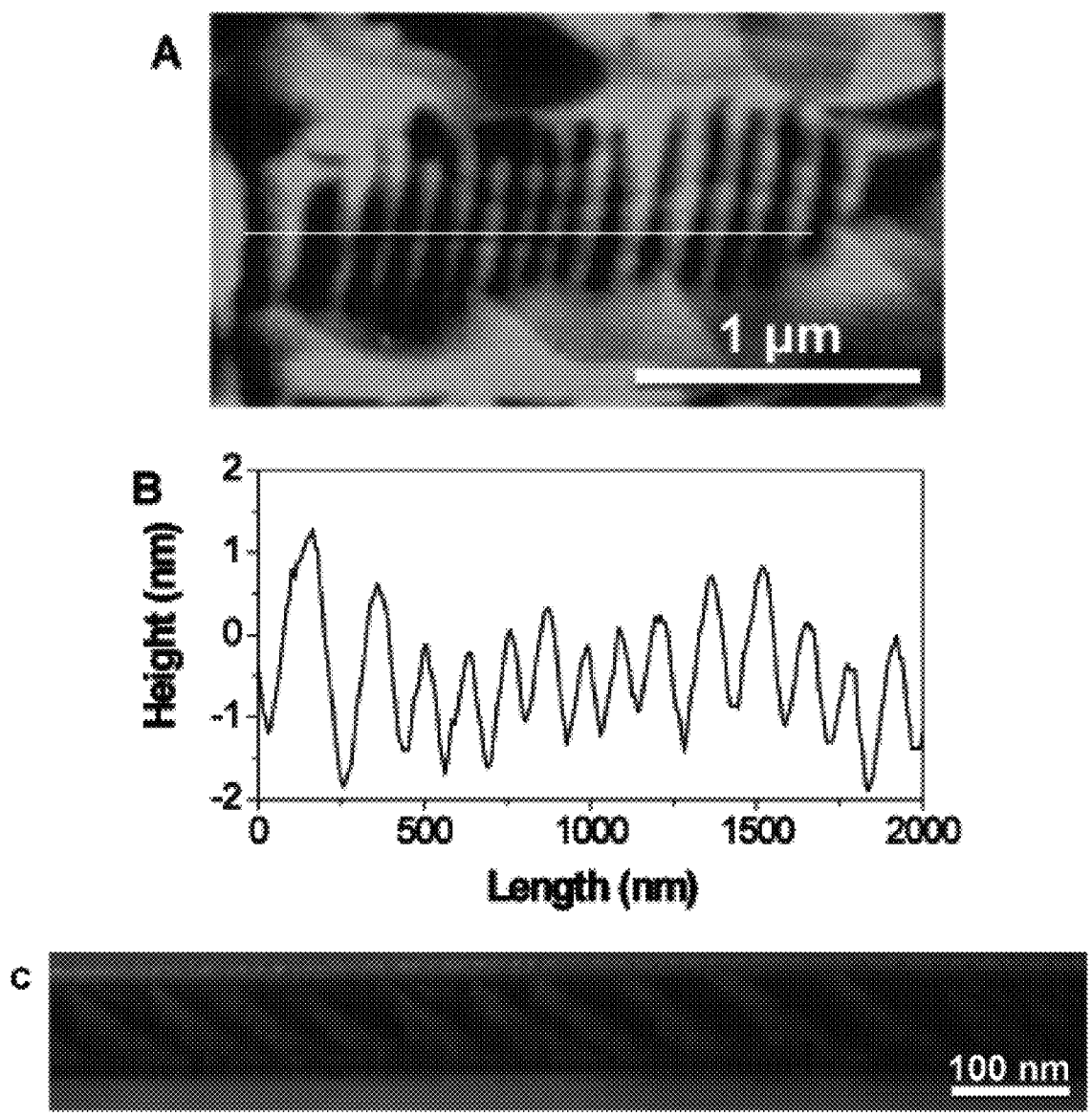
Figure 2A - C

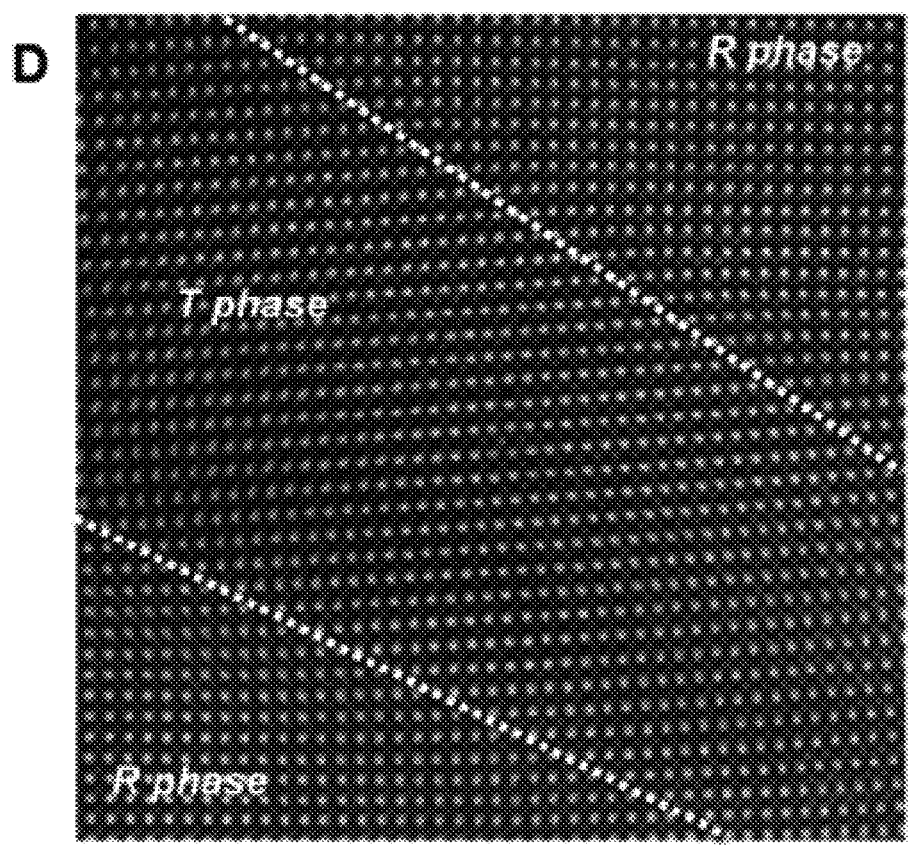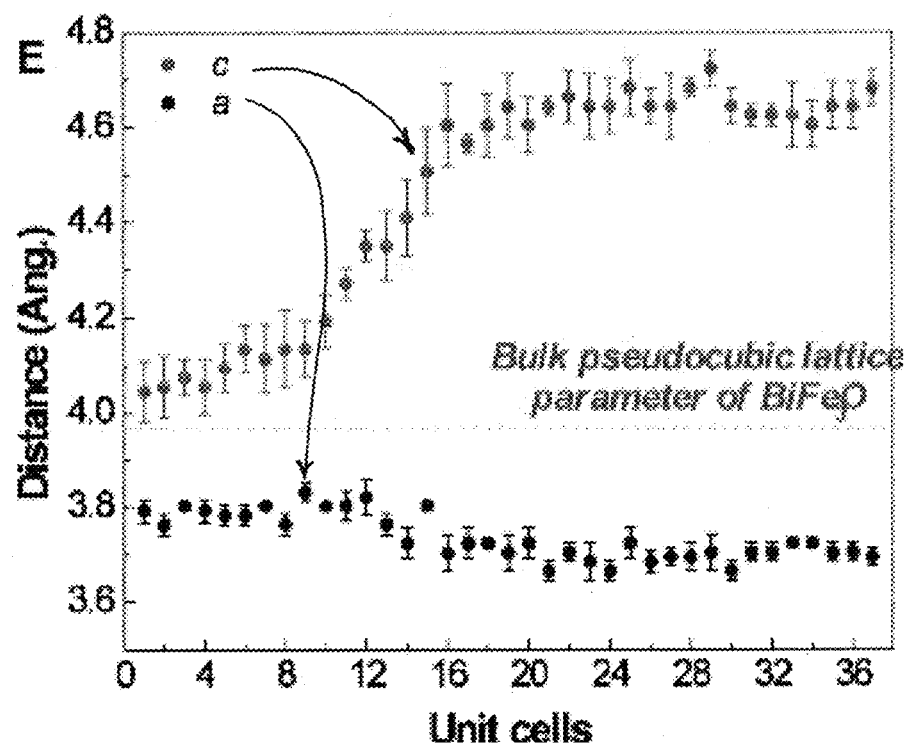
Figure 2D and E

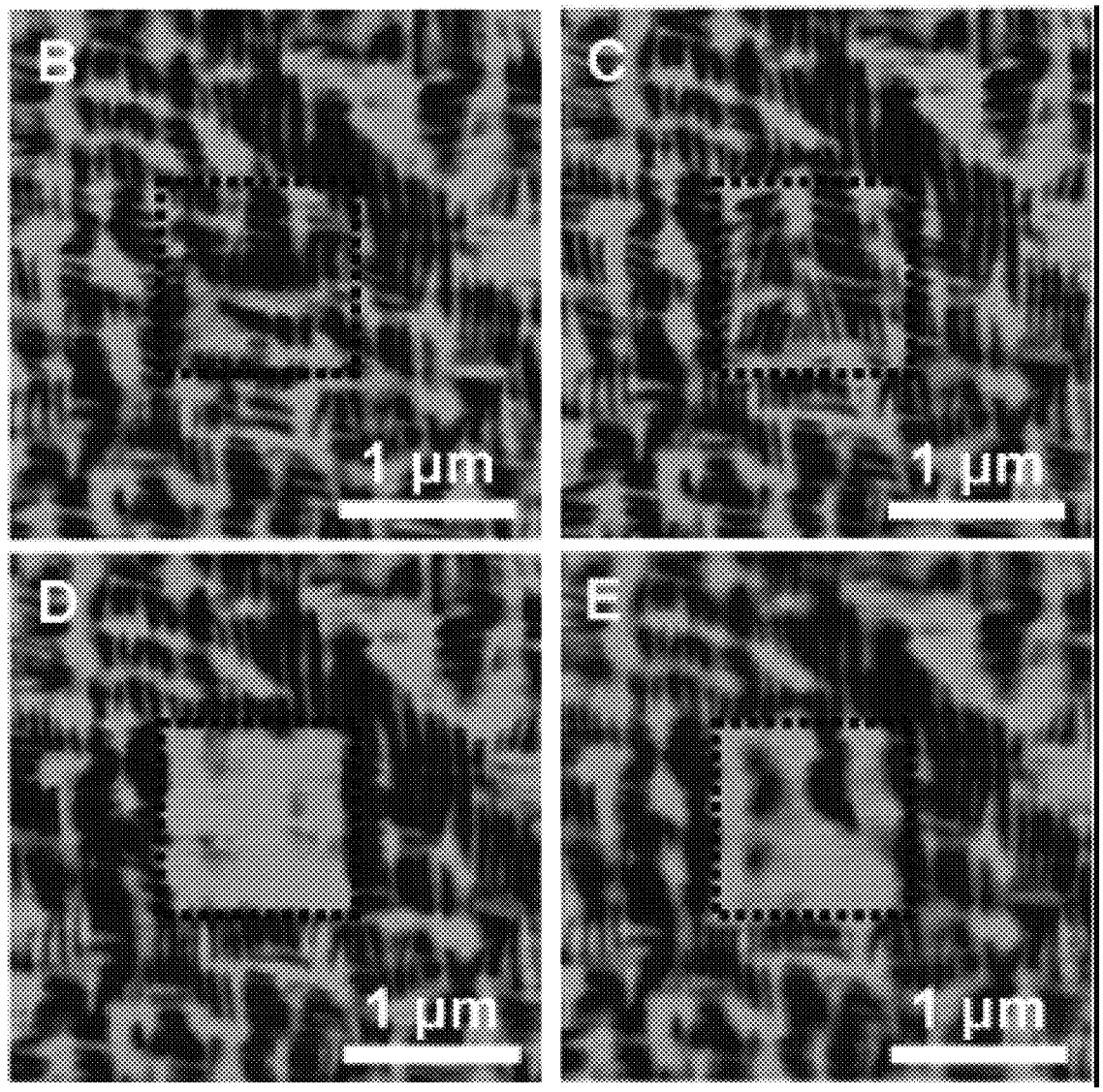
Figure 4B - E

THIN FILM BISMUTH IRON OXIDES USEFUL FOR PIEZOELECTRIC DEVICES

CROSS-REFERENCE TO RELATED APPLICATIONS

This application claims priority to U.S. Provisional Patent Application Ser. No. 61/256,897, filed Oct. 30, 2009, which is hereby incorporated by reference.

STATEMENT OF GOVERNMENTAL SUPPORT

This invention was made with government support under Contract No. DE-ACO2-05CH11231 awarded by the U.S. Department of Energy. The government has certain rights in the invention

FIELD OF THE INVENTION

The present invention is in the field of piezoelectrics.

BACKGROUND OF THE INVENTION

Modern functional materials, for example ferromagnets and piezoelectrics, are typically chemically complex and exhibit the co-existence of multiple phases that evolve as a consequence of chemical alloying. In such materials, huge responses to external stimuli are often found at phase boundaries. In the past two decades, examples of the discovery of such behavior include the emergence of colossal magnetoresistance in doped manganites, high temperature superconductivity in doped cuprates, and large piezoelectric responses in relaxor ferroelectrics. The large piezoelectric coefficients in $Pb(Zr_x,Ti_{1-x})O_3$ (PZT), $Pb(Mg_{0.33},Nb_{0.67})O_3$—$PbTiO_3$ (PMN-PT), and $Pb(Zn_{0.33},Nb_{0.67})O_3$—$PbTiO_3$ (PZN-PT) systems, for example, occur in compositions that lie at the boundary between two crystal structures, e.g., a rhombohedral-to-tetragonal phase boundary. These giant piezoelectric responses have made PZT, PMN-PT, and PZN-PT the materials of choice for a variety of applications ranging from micro-positioners to acoustic sensing in sonar. Notwithstanding the dramatic progress in the development of functional piezoelectric devices from these lead-based perovskites, two broad challenges remain: (i) lead-free alternatives to the above-mentioned systems, and (ii) viable alternative pathways that are fundamentally different from the chemical alloying approaches (such as that seen in the PZT and PMN-PT systems) to achieve large piezoelectric responses.

SUMMARY OF THE INVENTION

The present invention provides for a composition comprising a thin film of $BiFeO_3$ having a thickness ranging from 20 nm to 300 nm, a first electrode in contact with the $BiFeO_3$ thin film, and a second electrode in contact with the $BiFeO_3$ thin film; wherein the first and second electrodes are in electrical communication. The composition of the present invention is free or essentially free of lead (Pb). The BFO thin film is has the piezoelectric property of changing its volume and/or shape when an electric field is applied to the BFO thin film. The piezoelectric property of the BFO thin film is derived from the change of the BFO between a tetragonal-like phase and a rhombohedral-like phase. The BFO thin film is capable of a shape change or deformation of up to about 1.0% or 10% of its original dimension. The BFO thin film is capable of a shape change or deformation of up to 10 nm.

The present invention provides for a device comprising the composition of the present invention. The device can be a piezoelectric transformer, sonar, acoustic sensor, microbalance, strain gauge, vibration sensor, inchworm motor, auto focus motor in a reflex camera, stepping motor, atomic force microscope, scanning tunneling microscope, inkjet printer, piezoelectric fuel injector in a diesel engine, or the like. The device can also be a massively parallel capacitance based digital memory with potentially very high data densities, such as in an AFM probe-based data storage system.

The present invention provides for a surface acoustic wave (SAW) device comprising the composition comprising a thin film of $BiFeO_3$ having a thickness ranging from 20 nm to 300 nm, a first electrode in contact with the $BiFeO_3$ thin film, and a second electrode in contact with the $BiFeO_3$ thin film; wherein the first and second electrodes are in electrical communication.

The present invention also provides for a method of deforming the BFO thin film comprising: (a) providing a device of the present invention; and (b) creating a electric field through the BFO thin film, such that the BFO thin film is deformed. In some embodiments, the deformation is at least 1 nm. In some embodiments, the deformation is at least 5 nm. In some embodiments, the deformation is at least 10 nm. In some embodiments of the invention, the electric field is caused by passing a direct electric current through the first and second electrodes via through the BFO thin film.

The present invention also provides for a method of manufacturing the device of the present invention, comprising: (a) providing the first electrode layer on the substrate, (b) depositing the ferroelectric layer on the first electrode layer, and (c) depositing the second electrode layer on the ferroelectric layer.

The present invention also provides for a method of manufacturing the composition of the present invention, comprising: (a) optionally depositing a first substrate layer on a second substrate layer, (b) depositing a BFO thin film on the first substrate, and (c) attaching the first and second electrodes to the BFO thin film.

BRIEF DESCRIPTION OF THE DRAWINGS

The foregoing aspects and others will be readily appreciated by the skilled artisan from the following description of illustrative embodiments when read in conjunction with the accompanying drawings.

FIG. 1 shows: (A) X-ray diffraction of the pseudocubic 002-diffraction peak of BFO/STO (001), BFO/LAO(001), and BFO/YAO(110) shows the presence of a long-axis, T phase on both LAO and YAO substrates. Substrate peaks are marked with a star. (B) and (C) are atomic resolution STEM images of the T phase and the R phase, respectively. Insets show schematic illustration of the unit cell. (D) Illustrates the evolution of the structure with thickness including the area fraction (left axis) and the volume fraction of the R phase FIG. 2 shows: (A) High-resolution atomic force microscopy image of a mixed phase region. (B) Corresponding line trace at white line in (A) demonstrates ~2-3 nm height changes going from the T (bright) to R (dark) phase. (C) Low-resolution cross-sectional TEM image of a mixed phase region in a 85 nm thick BFO/LAO film. Here the light areas correspond to the T phase and the dark areas to the R phase. (D) High-resolution TEM image of the boundaries between R and T regions, indicated by dashed lines. A smooth transition between phases is observed; no dislocations or defects are found at the interface. (E) Corresponding in-plane (a, black) and out-of-plane (c, red) lattice parameters (mean+/−SD)

demonstrate nearly a 13% change in the out-of-plane lattice parameter in just under 10 unit cells

DETAILED DESCRIPTION OF THE INVENTION

Figure 3:
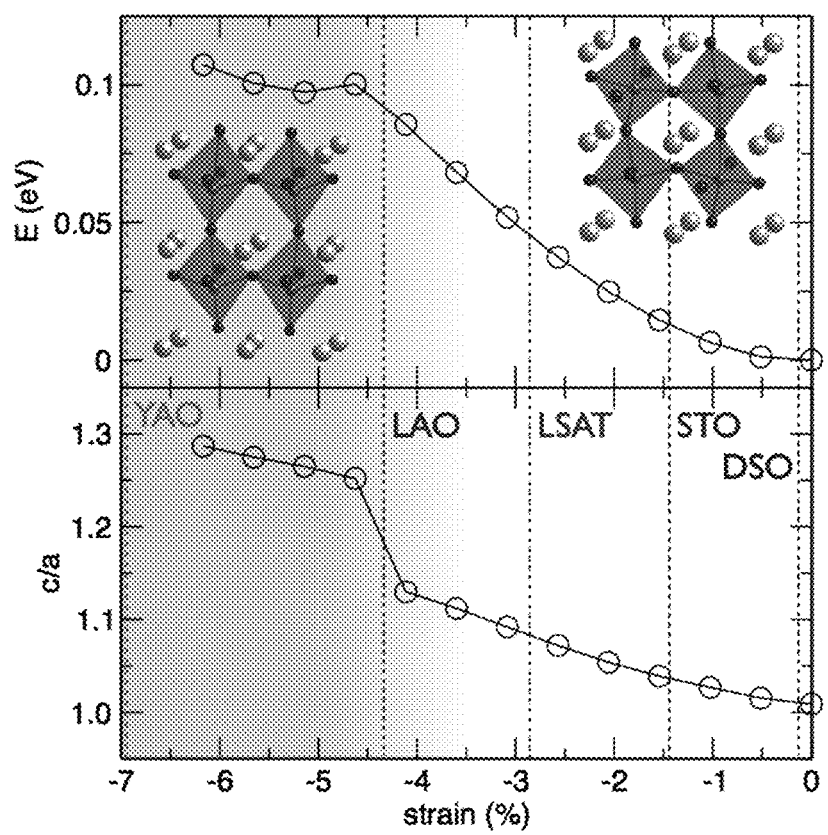
FIG. 3 shows: (A) Evolution of the energy of the BFO structure as a function of in-plane strain. (B) Evolution of the c/a lattice parameter ratio as a function of strain for BFO. These data show the presence of two phases—both with monoclinic symmetry—the long-axis T phase (left) and the short-axis R phase. The lattice mismatch between a number of commonly used and tested oxide substrates are shown as dashed lines

Before the invention is described in detail, it is to be understood that, unless otherwise indicated, this invention is not limited to particular sequences, expression vectors, enzymes, host microorganisms, or processes, as such may vary. It is also to be understood that the terminology used herein is for purposes of describing particular embodiments only, and is not intended to be limiting.

As used in the specification and the appended claims, the singular forms "a," "an," and "the" include plural referents unless the context clearly dictates otherwise.

In this specification and in the claims that follow, reference will be made to a number of terms that shall be defined to have the following meanings:

The terms "optional" or "optionally" as used herein mean that the subsequently described feature or structure may or may not be present, or that the subsequently described event or circumstance may or may not occur, and that the description includes instances where a particular feature or structure is present and instances where the feature or structure is absent, or instances where the event or circumstance occurs and instances where it does not.

The present invention provides for a composition comprising thin film of $BiFeO_3$ having a thickness ranging from 20 nm to 300 nm, a first electrode in contact with the $BiFeO_3$ thin film, and a second electrode in contact with the $BiFeO_3$ thin film; wherein the first and second electrodes are in electrical communication. The composition of the present invention is free or essentially free of lead (Pb).

The $BiFeO_3$ thin film can be of any suitable thickness. In some embodiments, the ferroelectric layer is of uniform thickness, such as within the area where it is in contact with the first and second electrodes. The $BiFeO_3$ thin film can be at least 20 nm, 30 nm, 50 nm, or 100 nm in thickness. The $BiFeO_3$ thin film can be up to 100 nm, 200 nm, or 300 nm in thickness. The $BiFeO_3$ thin film can be of any thickness defined within the aforementioned lower and upper dimensions. In some embodiments of the invention, the thickness of the $BiFeO_3$ thin film is from 20 nm to 200 nm, or from 50 nm to 150 nm.

The BFO thin film is has the piezoelectric property of changing its volume and/or shape when an electric field is applied to the BFO thin film. The piezoelectric property of the BFO thin film is derived from the change of the BFO between a tetragonal-like phase and a rhombohedral-like phase. The BFO thin film is capable of a shape change or deformation of up to about 1.0% or 1.5% of its original dimension. The BFO thin film is capable of a shape change or deformation of up to 10 nm.

In some embodiments of the invention, the composition comprises a plurality of pairs of electrodes; wherein the pairs of electrodes are in a series or in an array, and each pair of electrode is in electrical communication, that is, the two electrodes within each pair is in electrical communication with each other.

In some embodiments of the invention, the BFO thin film is epitaxial or prepared by molecular beam epitaxy (MBE) or laser-MBE on single crystal substrates of a suitable crystal, such as (001) $LAlO_3$ (LAO) (rhombohedral with a pseudocubic a=3.79 Å) and (110) $YAlO_3$ (YAO) (orthorhombic with a pseudocubic a=3.69 Å). In some embodiments of the invention, the BFO thin film is prepared by chemical bath deposition (CBD).

In some embodiments of the invention, the composition further comprises a first substrate layer wherein the BFO thin film resides on the first substrate layer. In some embodiments of the invention, the first substrate layer comprises LAO and/or YAO. In some embodiments of the invention, the first substrate layer comprises $CaBi_4Ti_4O_{15}$ (CBT). In some embodiments of the invention, the composition further comprises a second substrate layer wherein the first substrate layer resides on the second substrate layer. For example, the first substrate layer is sandwiched between the BFO thin film and the second substrate layer. In some embodiments of the invention, the second substrate layer comprises a semiconductor, such as Si. The thickness of the first substrate layer can be equal or greater than the thickness of the BFO thin film. The thickness of the second substrate layer can be equal or greater than the thickness of the BFO thin film. The thickness of the second substrate layer can be equal or greater than the thickness of the first substrate layer. The thickness of the second substrate layer can be equal or greater than the combined thickness of the BFO thin film and the first substrate layer. When the second substrate layer is Si, the second substrate layer can be produced using a semiconductor fabrication plant (fab) process. The first and second electrodes are each independently any material capable of conducting an electric current, such suitable materials include metal or organic conductors.

The present invention provides for a device comprising the composition of the present invention. The device can be a piezoelectric transformer, sonar, acoustic sensor, microbalance, strain gauge, vibration sensor, inchworm motor, auto focus motor in a reflex camera, stepping motor, atomic force microscope, scanning tunneling microscope, inkjet printer, piezoelectric fuel injector in a diesel engine, or the like. The device can also be a massively parallel capacitance based digital memory with potentially very high data densities.

The present invention provides for a surface acoustic wave (SAW) device comprising the composition comprising a thin film of $BiFeO_3$ having a thickness ranging from 20 nm to 300 nm, a first electrode in contact with the $BiFeO_3$ thin film, and a second electrode in contact with the $BiFeO_3$ thin film; wherein the first and second electrodes are in electrical communication.

The present invention also provides for a method of deforming the BFO thin film comprising: (a) providing a device of the present invention; and (b) creating a electric field through the BFO thin film, such that the BFO thin film is deformed. In some embodiments, the deformation is at least 1 nm. In some embodiments, the deformation is at least 5 nm. In some embodiments, the deformation is at least 10 nm. In some embodiments of the invention, the electric field is caused by passing a direct electric current through the first and second electrodes via through the BFO thin film.

The present invention also provides for a method of manufacturing the composition of the present invention, comprising: (a) optionally depositing a first substrate layer on a second substrate layer, (b) depositing a BFO thin film on the first substrate, and (c) attaching the first and second electrodes to the BFO thin film.

The $BiFeO_3$ (BFO) thin films can be deposited using an MOCVD process with a liquid injection delivery system. The precursor materials, such as triphenylbismuth ($BiPh_3$) and iron III tris(2,2,6,6-tetramethyly-3,5-heptanedionate) (Fe(thd)$_3$), both dissolved in THF, are mixed in various ratios and injected into a heated vaporizing column held at a temperature sufficient to vaporize most of the material, about 220° C. A typical liquid injection rate is 0.1 mL/min. A flowing argon carrier gas transports the vaporized metalorganics to a hot wall reaction chamber, where upon entry, it is intimately mixed with supplied oxygen gas by passing both through a showerhead. Typical flow rates of the gases are 200 and 500 sccm for argon and oxygen, respectively. The pressure in the reaction chamber is kept constant throughout the process, at 2 torr in the current example.

The BFO thin films are deposited on heated substrates by thermal decomposition of the constituent precursor materials. The substrates are held at a higher temperature than the surrounding chamber by a stage typically heated in the range 450-750° C. Appropriate matching of precursor materials (vapor pressures, decomposition temperatures, etc.) and process conditions (precursor mixing ratios, stage temperature, chamber pressure, etc.) yields films with tunable stoichiometry.

In some embodiments, the BFO thin film is deposited onto a Si substrate. In some embodiments, the BFO layer is deposited onto an ITO coated glass surface, such as by a chemical vapor deposition process.

The present invention can be applied in applications such as piezoelectric transformers, sonar, acoustic sensors, microbalances, strain gauges, vibration sensors, inchworm motors, auto focus motors in reflex cameras, stepping motors, atomic force microscopes, scanning tunneling microscopes, inkjet printers, piezoelectric fuel injectors in diesel engines and the like. Further, the present invention could be used in massively parallel capacitance based digital memory with potentially very high data densities—analogous to the IBM Millipede project with capacitance based bit detection in place of thermal detection. Any of the devices described above can be arranged in series and/or in array.

REFERENCES CITED

1. P. Groth, *Ann. Phys. Chem.* 217, 31 (1870).
2. V. M. Goldschmidt, *Trans. Faraday Soc.* 25, 253 (1929).
3. W. Eerenstein, N. D. Mathur, J. F. Scott, *Nature* 442, 759 (2006).
4. R. Ramesh, N. A. Spaldin, *Nat. Mater.* 6, 21 (2007).
5. C. Ederer, N. A. Spaldin, *Phys. Rev. Lett.* 95, 257601 (2005).
6. P. Ravindran, R. Vidya, A. Kjekshus, H. Fjellvag, *Phys. Rev. B* 74, 224412 (2006).
7. D. Ricinschi, K.-Y. Yun, M. Okuyama, *J. Phys. Condens. Matter* 18, L97-L105 (2006).
8. H. Béa et al., *Phys. Rev. Lett.* 102, 217603 (2009).
9. D. G. Schlom et al., *Annu. Rev. Mater. Res.* 37, 589 (2007).
10. F. Zavaliche et al., *Phase Transit.* 79, 991 (2006).
11. G. Xu, et al., *Appl. Phys. Lett.* 86, 182905 (2005).
12. Y. H. Chu et al., *Appl. Phys. Lett.* 90, 252906 (2007).
13. H. Béa et al., *Phys. Rev. B* 74, 020101 (2006).
14. K. Y. Yun et al., *J. Appl. Phys.* 96, 3399 (2004).
15. M. F. Chisholm et al., *Microsc. Microanal.* 10, 256 (2004).
16. G. Kresse, J. Furthmüller, *Phys. Rev. B* 54, 11169 (1996).
17. V. I. Anisimov, F. Aryasetiawan, A. I. Liechtenstein, *J. Phys. Condens. Matter* 9, 767 (1997).
18. G. Christy, *Acta Cryst.* B51, 753 (1995).
19. R. V. Shpanchenko et al., *Chem. Mater.* 16, 3267 (2004).
20. Belik et al., *Chem. Mater.* 18, 798 (2006).
21. S. Hong, Ed., *Nanoscale Phenonmena in Ferroelectric Thin Films* (Kluwer Academic Publishing, Boston, Mass., 2004).

The invention having been described, the following examples are offered to illustrate the subject invention by way of illustration, not by way of limitation.

EXAMPLE 1

Piezoelectric materials, which convert mechanical to electrical energy and vice versa, are typically characterized by the intimate coexistence of two phases across a morphotropic phase boundary. Electrically switching one to the other yields large electromechanical coupling coefficients (refs. 1 and 2). Driven by global environmental concerns, there's currently a strong push to discover practical lead-free piezoelectrics for device engineering. Using a combination of epitaxial growth techniques in conjunction with theoretical approaches, we show the formation of a morphotropic phase boundary via epitaxial constraint in lead-free piezoelectric $BiFeO_3$ films. Electric field dependent studies show that a tetragonal-like phase can be reversibly converted into a rhombohedral-like phase, accompanied by measurable displacements of the surface, making this new lead-free system of interest for probe-based data storage and actuator applications. Epitaxial strain is demonstrated to be useful in driving the formation of a morphotropic phase boundary and create large piezoelectric responses in lead-free ferroelectric materials.

BiFeO$_3$ (BFO) is a multiferroic perovskite that exhibits antiferromagnetism coupled with ferroelectric order (ref. 3 and 4). The structural stability of the parent rhombohedral phase of this material has been the focus of a number of theoretical studies (refs. 5 and 6). Although the parent ground state is a rhombohedrally distorted perovskite (R3c), a tetragonally distorted perovskite phase (P4 mm symmetry, a~3.665 Å and c~4.655 Å) with a large spontaneous polarization has been identified (refs. 7, 8, and 11). The "T" notation is used in reference to a parent tetragonal phase with P4mm symmetry which has a c-axis lattice parameter of ~4.65 Å and encompasses small monoclinic distortions from this tetragonal symmetry. Similarly, the "R" notation is used in reference to a distorted form of the R3c parent phase which has a c-axis of ~4.0 Å. It is established that strain is particularly effective in altering the stable crystal structure of thin films where strains of several percent can be imparted through commensurate epitaxial growth on an underlying substrate (ref 9). The epitaxial strain can be used to stabilize a tetragonal polymorph of BFO and that intermediate strains position BFO on a morphotropic phase transition between its T and R polymorphs. After establishing the characteristics of the pure T polymorph, it is shown that the T and R phases can coexist on a length scale of tens of nanometers in films grown with intermediate strain and have huge piezoelectric responses.

Epitaxial BFO films is grown using conventional molecular beam epitaxy (MBE) and laser-MBE on single crystal substrates of (001) LaAlO$_3$ (LAO) (rhombohedral with a pseudocubic a=3.79 Å) and (110) YAlO$_3$ (YAO) (orthorhombic with a pseudocubic a=3.69 Å). Reference rhombohedral polymorphs of BFO are grown on (001) SrTiO$_3$ (STO) (cubic with a=3.905 Å) substrates. For electrical and piezoresponse force microscopy (PFM) studies only, a 3-50 nm layer of epitaxial La$_{0.5}$Sr$_{0.5}$CoO$_3$ (LSCO) (a=3.82 Å) or La$_{0.7}$Sr$_{0.3}$MnO$_3$ (LSMO) (a=3.85 Å) is used as a bottom electrode. Detailed structural characterization is completed by a combination of x-ray diffraction, reciprocal space mapping, and scanning transmission electron microscopy based atomic imaging (TEAM 0.5 at the National Center for Electron Microscopy). Ferroelectric domains are imaged and switched using PFM as described previously (ref. 10). Local surface displacements are measured using high-resolution atomic force microscopy (AFM) as a function of applied DC field.

Figure 5:
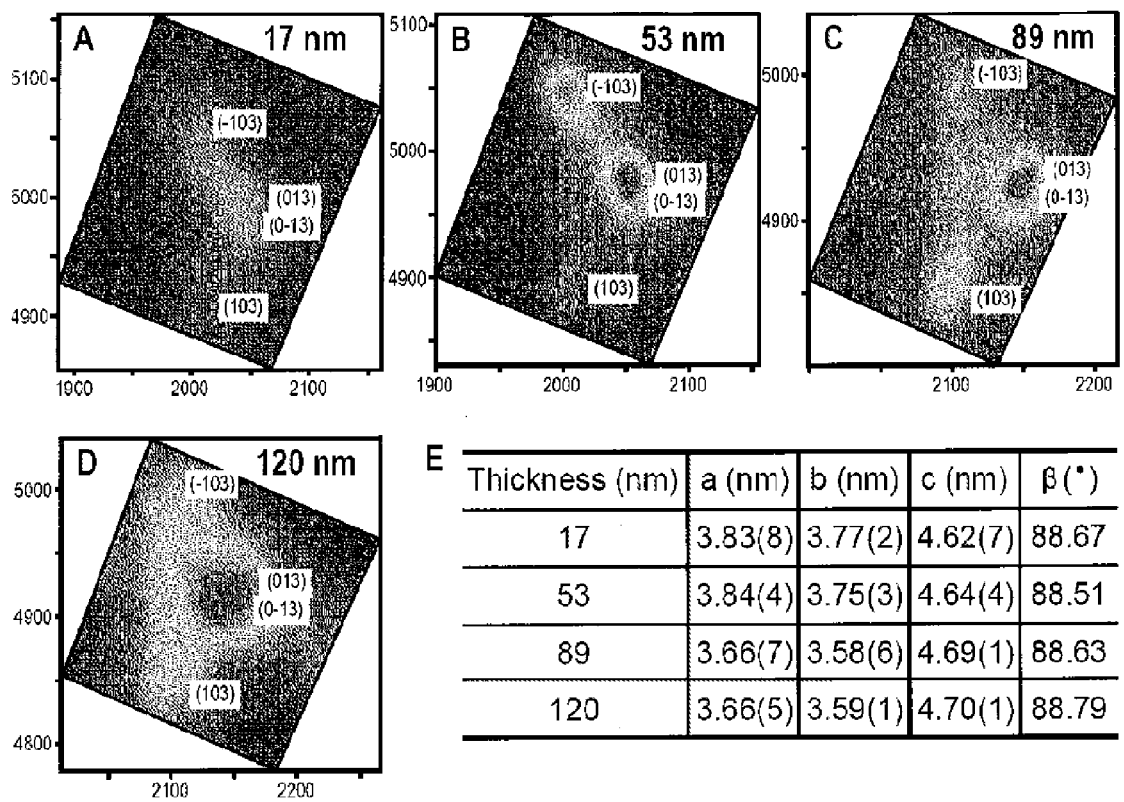
FIG. 5 shows the reciprocal space maps of the 103 and 013 diffraction peaks of the tetragonal BFO phase in (A) 17 nm, (B) 53 nm, (C) 89 nm, and (D) 120 nm thick films. The x and y axes are Qx*10000 (r.l.u) and Qy*10000 (r.l.u) respectively. The table in (E) summarizes the structure of the various unit cells based on these detailed x-ray diffraction studies.

These measurements of the structural aspects of the T phase and its evolution with thickness are completed without a bottom electrode in order to understand the direct influence of epitaxial constraint on the phase evolution. FIG. 1A shows a typical $\omega-2\theta$ scan of BFO films grown on LAO, YAO, and STO substrates. The films grown on the reference STO substrate show the same monoclinically distorted rhombohedral structure that is established in the literature (refs. 11-14). In contrast, the films grown on LAO and YAO exhibit strong reflections at 2θ values corresponding to an out-of-plane lattice parameter of ~4.65 Å. Detailed reciprocal space mapping scans as a function of film thickness reveal a number of interesting aspects. First, for thinner films on LAO substrates (less than ~50 nm), the in-plane lattice parameters are measured to be a~3.84 Å and b~3.76 Å, respectively. (See FIG. 5 for reciprocal space map data used to determine these lattice constants.) Second, a monoclinic tilt is observed of the structure with β~88.6°. On the other hand, for thicker films (>50 nm) the coexistence of the two phases is observed. The insets of FIGS. 1B and 1C schematically describe the T and R phases discussed herein.

Figure 6:
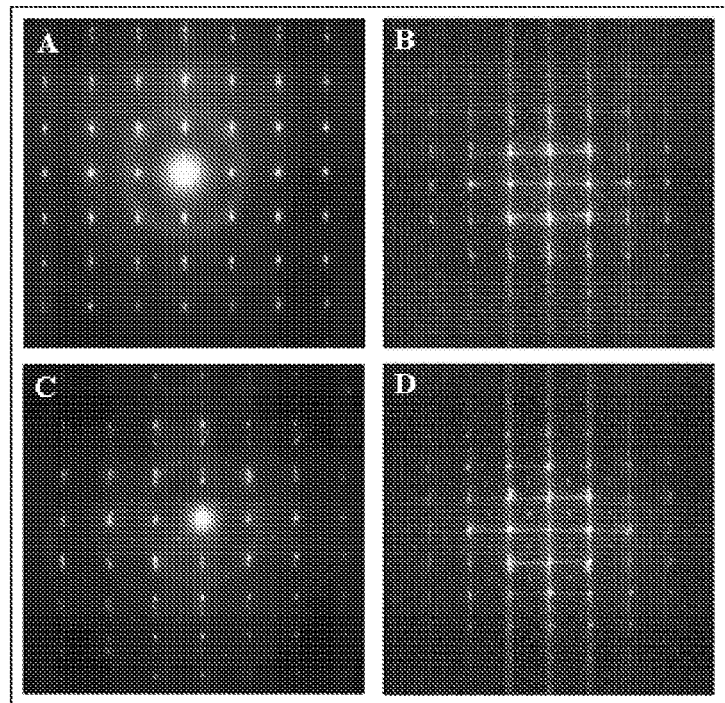
FIG. 6 shows the electron diffraction patterns and Fourier transforms, respectively, for rhombohedral BFO (A and B) and tetragonal BFO(C and D), which correspond to FIGS. 1B and 1C, reveal distinct differences in symmetry.

The atomic structure of these two phases is imaged directly using the TEAM 0.5 transmission electron microscope. Atomic resolution high-angle annular dark-field scanning transmission electron microscopy (HAADF-STEM) images, also referred to as Z-contrast images, of these two different phases are shown in FIGS. 1B and 1C, respectively. Both images are acquired along the perovskite pseudo-cubic direction and exhibit atomic columns with two distinct intensities, with the Bi atom columns appearing brighter than the Fe atom columns. The strong atomic-number contrast of HAADF-STEM prevents the observation of the oxygen atomic columns next to the cation-containing columns (ref 15). It is interesting to note that the small size of the aberration-corrected electron probe (~0.6 Å) used for the HAADF-STEM imaging and the high mechanical and electrical stability of the microscope employed allowed for resolving the displacement of the Fe atoms from the center of the unit cell defined by Bi rectangles. The electron diffraction patterns and the Fourier transforms in FIG. 6, obtained from the images in FIGS. 1B and 1C, reveal clear differences between the symmetries of the T and R phases.

Figure 7:
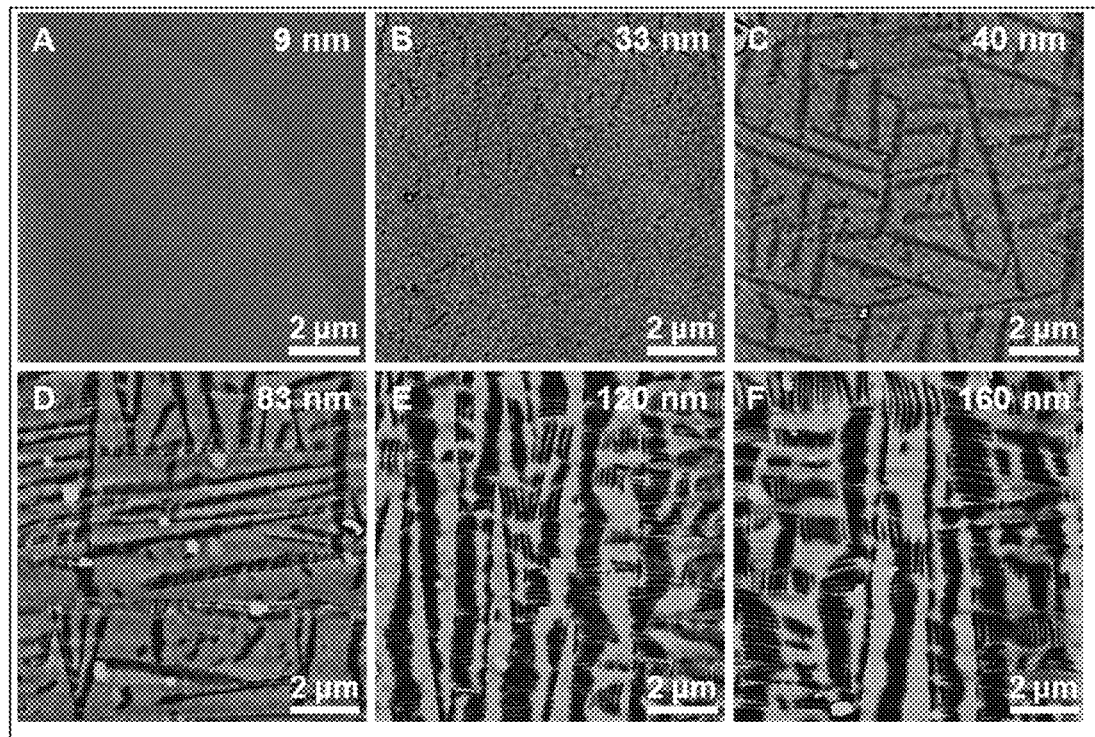
FIG. 7 shows the thickness dependence evolution of surface morphology as probed by atomic force microscopy for (A) 9 nm, (B) 33 nm, (C) 40 nm, (D) 83 nm, (E) 120 nm, and (F) 160 nm. Analysis of these images is used to determine the relative areal fraction of R and T phases displayed in FIG. 1D.

As the films are made thicker, the emergence of the R phase that coexists with the T phase is observed. The relative areal and volume fractions of these two phases as a function of film thickness are shown for films on both LAO and YAO substrates in FIG. 1D. Areal fractions are calculated from detailed high-resolution AFM studies of the surface, shown in FIG. 7. As expected, in the case of films grown on YAO (the substrate with the smallest lattice mismatch with the T phase), the film is observed to remain essentially tetragonal-like for the range of thicknesses studied. In contrast, films grown on LAO show a distinct evolution of the phase mixture due to relaxation of the epitaxial strain with increased thickness.

High resolution AFM images (FIG. 2A) show a characteristic striped contrast that we attribute to the mixed phase. From such images, the spacing of the stripes is measured to be ~30-50 nm, with a peak-to-valley height difference of 1-2 nm (FIG. 2B). Low- and high-resolution transmission electron microscopy (TEM) studies of this mixed phase region is carried out. FIG. 2C shows a typical low magnification TEM image of the portion of the sample that exhibits the striped contrast. The spacing of the stripes in this image is commensurate with that obtained in the AFM image, i.e., 30-50 nm. Higher resolution atomic imaging (carried out on the TEAM 0.5 microscope) reveals the structural details of this mixed phase (FIG. 2D), in which the T phase is interspersed between two R phase regions. The structure changes smoothly from the T phase to the R phase over a distance of ~10 unit cells, as shown in FIG. 2E. Specifically, the out-of-plane lattice parameter changes from 4.06 Å in the R phase to 4.65 Å in the T phase without the insertion of misfit dislocations. The in-plane lattice parameter is constrained by the substrate lattice parameter and changes slightly (from ~3.8 Å in the R phase to ~3.7 Å in the T phase). Thus, the c/a ratio changes from 1.07 for the R phase to 1.27 in the T phase in just over 10 unit cells.

To understand the observed coexistence of T and R phases, density functional calculations is performed within the local density approximation plus the Hubbard parameter U (LDA+U) approximation ($U_{eff}$=U−J=2 eV), using the projector augmented wave (PAW) method as implemented in the Vienna ab-inito simulation package (VASP) (refs. 16 and 17). A monoclinic 10 atom unit cell is used which allows the structure to continuously change from the rhombohedral R3c symmetry of bulk BFO to the P4mm tetragonal symmetry. A 5×5×5 k-point sampling, a plane wave energy cut-off of 550 eV, and an assumption of the G-type antiferromagnetic ordering of bulk BFO are employed. To simulate the effect of epitaxial strain the unit cell lattice vectors are constrained in the pseudocubic (001) plane and relax the out-of-plane cell parameter and all internal coordinates by minimizing the Hellman-Feynman forces to a tolerance of 0.005 eV/Å. The internal coordinates are initialized corresponding to monoclinic Cc symmetry. The results for compressive strain are shown in FIGS. 3A and B. Strains are given relative to the LDA+U equilibrium lattice parameter a=3.89 Å of bulk R3c BFO.

For a compressive strain around 4.5% BFO undergoes a strain-induced iso-symmetric structural transformation (ref 18) which is accompanied by an abrupt increase in c/a ratio (FIG. 3B). Although the structures on both sides of this transition have the same monoclinic symmetry (Cc), there is a distinct change in the ionic coordinates from a distorted version of the rhombohedral bulk structure (with octahedral coordination of the $Fe^{3+}$ cation) to a structure with essentially five-fold coordination of the Fe cation, resembling the "super-tetragonal" structure observed for $PbVO_3$ and $BiCoO_3$ (refs. 19 ad 20), but with additional tilting of the oxygen polyhedra (see insets in FIG. 3A). The energy versus strain curve (FIG. 3A) shows a maximum separating the two lower energy phases at around 4.5% strain, suggesting that films strained to this critical value may lower their energy by spontaneously phase-separating into the T and R phases. In this case, the two phases have in-plane lattice parameters that are smaller and larger, respectively, than that of the substrate, allowing for phase-separation without an over-all change of in-plane film dimensions. Films grown at higher strain values will be in the metastable tetragonal-like phase energy minimum and are not expected to phase separate. The evolution of the BFO films is studied on a wide range of substrates including (110) $DyScO_3$ (DSO) (a=3.94 Å), STO (a=3.905 Å), (001) $(LaAlO_3)_{0.3}(SrAl_{0.5}Ta_{0.5}O_3)_{0.7}$ (LSAT) (a=3.87 Å), LAO (a=3.79 Å), and YAO (a=3.69 Å) (all lattice parameters reported here are the cubic or pseudocubic values and the lattice mismatch relative to bulk BFO are shown in FIGS. 3A and 3B). These studies show that BFO films on YAO consist entirely of the T phase for film thicknesses up to ~220 nm, while films on LAO are mixed T and R phases, and films on LSAT, STO, and DSO are rhombohedral-like in nature, consistent with the theoretical predictions in FIG. 3.

Figure 8:
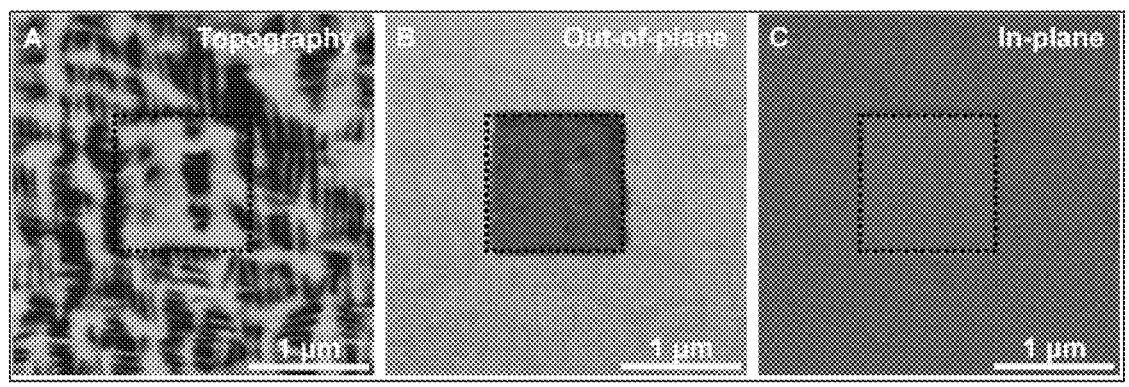
FIG. 8 shows: (A) Topography of a poled 85 nm thick BFO/LSCO/LAO (001) thin film (height scale is 5 nm). (B) Out-of-plane and (C) in-plane piezoresponse force microscopy image of a film poled with a −10 V DC field. The black boxes demarcate the area that was switched.

The surface displacements and piezoelectric properties are probed on a local scale using AFM and PFM. An overview of the piezoelectric switching behavior for such a sample is shown in FIG. 8. The AFM image (FIG. 8A) shows two major topographical features: bright plateaus to arise from the T phase and areas of stripe-like contrast that arise from mixed T and R regions. The corresponding out-of-plane (FIG. 8B) and in-plane (FIG. 8C) PFM images show that there is an out-of-plane switching of the polarization upon application of an electric field and the in-plane image shows no change in contrast consistent with the idea that the polarization vector is primarily perpendicular to the sample surface.

Figure 4A:
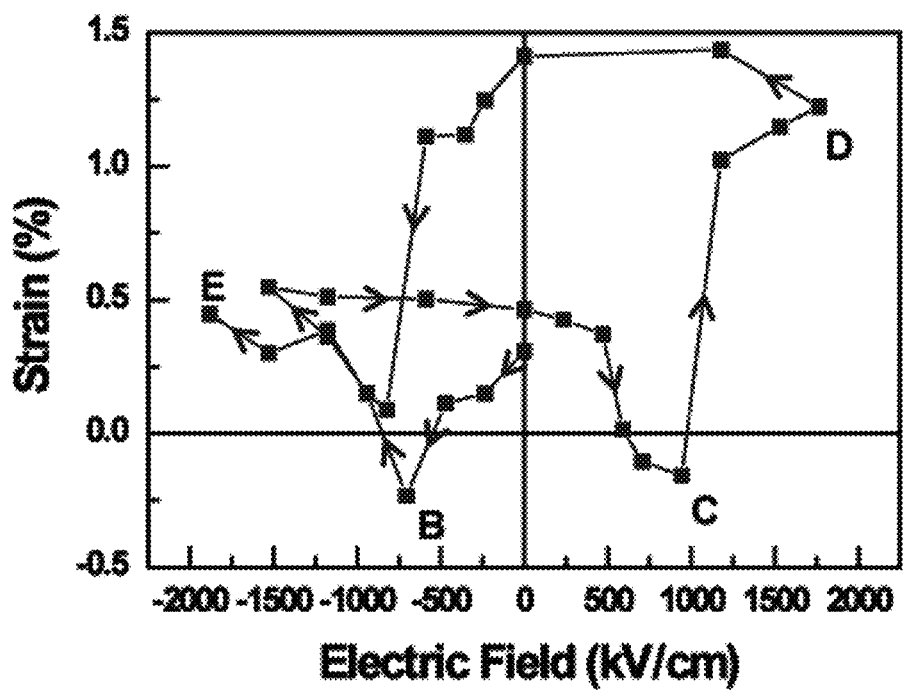
FIG. 4 shows: (A) Electric field induced changes in surface displacement, here represented as strains, show a classic "butterfly" loop structure. Corresponding atomic force microscopy images at (B) −1880 kV/cm, (C) −705 kV/cm, (D) 1760 kV/cm, and (E) 941 kV/cm are shown. At the extremes of applied voltage a clear, single contrast is observed in the switched box corresponding to the presence of the tetragonal phase. A dashed line indicates the area that was subjected to the electric field.
Figure 9:
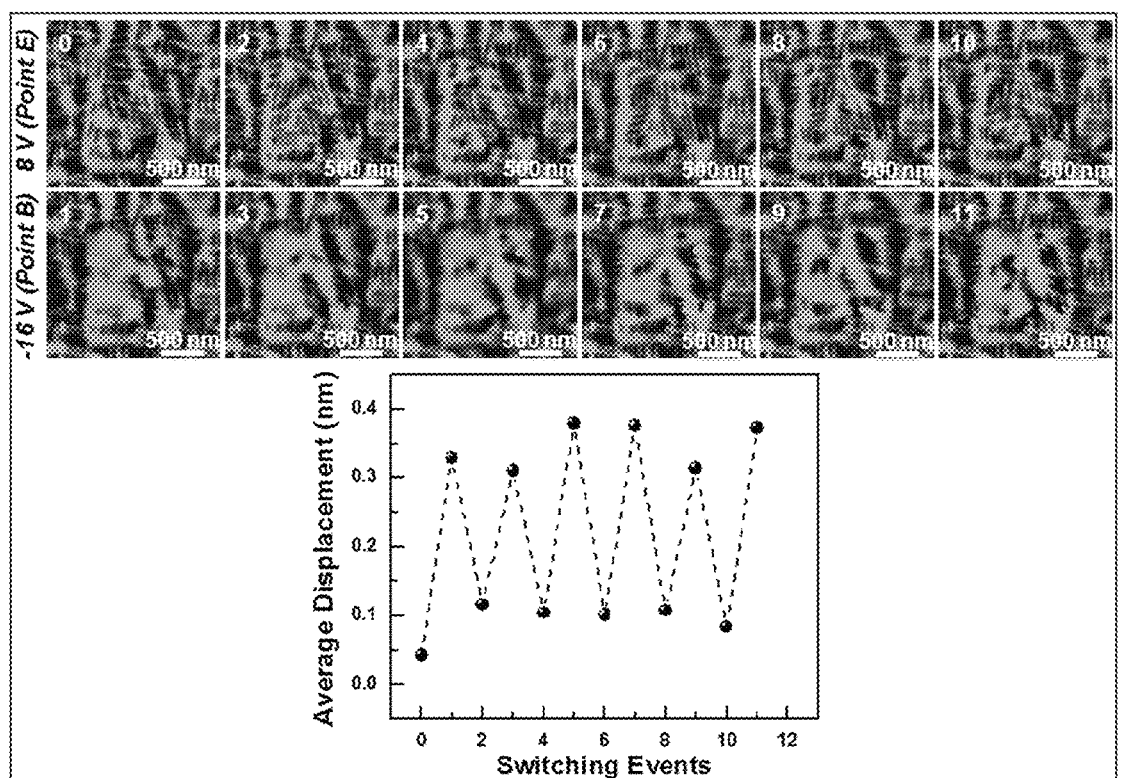
FIG. 9 shows the reversibility of the electrically driven phase change as is probed. The images (0-11) correspond to switching a 1 micron square box with alternating −1880 kV/cm and 941 kV/cm electric fields. No change in the average surface displacement over the switched area is observed in over 10 switching events.
Figure 10:
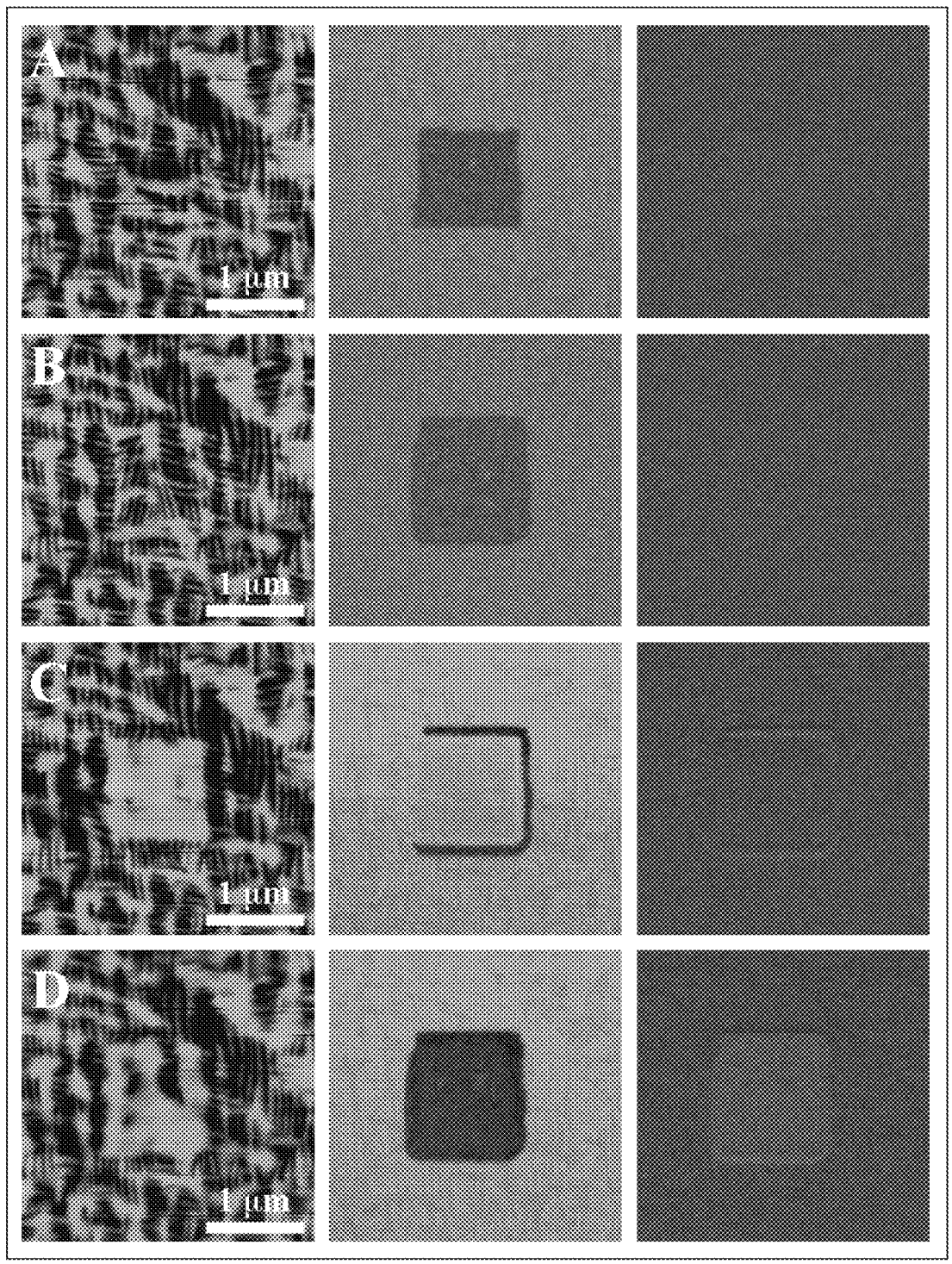
FIG. 10 shows from left to right: topography, out-of-plane, and in-plane PFM contrast of the film switched with a (A) −6 V, (B) +6 V, (C) +15 V, and (D) −13 V DC field.

The piezoelectric behavior of an 85 nm thick, mixed T and R phase sample is studied. The normalized relative surface displacement of a local poled area as a function of electric field applied to the scanning probe tip is measured (FIG. 4A). (FIG. 10 shows in-plane and out-of-plane PFM data corresponding to FIGS. 4B-E). Measurements are repeated at five locations on each of five different samples to ensure repeatability. The relative displacements are measured by comparing the average height within the switched area to the entire scanned area outside of the switched area. These relative displacements are then converted to strain values. The data in this figure presents several interesting features: first is the observation of a "butterfly-loop", which is typical of the strain vs. field behavior that is commonly observed in piezoelectrics. At the highest fields (both positive and negative polarity) the relative deformation is the highest; this corresponds to an essentially single domain, tetragonal-like state of the sample, as exemplified by the uniform image contrast in the AFM images (FIGS. 4D and 4E). In contrast, at the lowest value of relative displacement, the AFM images (FIGS. 4B and 4C) show clear signatures of stripe-like image contrast, indicative of a mixed state. As shown in FIG. 9, one is able to reversibly switch it through the states shown in FIGS. 4B-D. The absolute value of the local surface displacement is ~1-2 nm/85 nm of film thickness. This corresponds to an effective strain of 1.2-2.4%, which is of the same order of magnitude as the highest strains reported for the relaxor ferroelectrics. These relatively large and nonvolatile changes in surface displacements make this an attractive system for use in nanoscale data storage elements (such as probe based data storage) and microscale actuators (ref 21).

These results demonstrate the ability of the BFO system to morph into allotropic modifications. These forms are stabilized through the epitaxial strain imposed by the substrate. Of particular interest from the piezoelectrics point of view is the mixed phase state of the films. The ability to reversibly convert the T phase to a mixture of T and R phases through the application of an electric field suggests a close resemblance to other well-known piezoelectrics such as the morphotropic phase boundary compositions in the PZT family and the PMN-PT family. These observations support the notion that such strain-driven phase evolution is a generic feature, akin to chemically driven phase changes that are now well established in the manganites, cuprates, and relaxors. Furthermore, the observation of the strain-driven phase changes in BFO should motivate a search for similar control in other related perovskite systems. Furthermore, this reversible inter-conversion is accompanied by substantial changes in the height of the sample surface (a few nm), thus making this potentially attractive for AFM probe-based data storage applications.

Materials and Methods

X-Ray Diffraction and Reciprocal Space Mapping.

High-resolution reciprocal space mapping (RSM) studies are completed on $BiFeO_3$ (BFO) of varying thicknesses grown on (001) $LaAlO_3$ (LAO) substrates using a Panalytical X'Pert MRD Pro 4-circle diffractometer. Line scans along the L-direction in (hkl) RSMs for the 103 and 013 reflections are measured. Based on this analysis one is able to determine all three lattice parameters as well as monoclinic tilt of the structure, β (FIG. 5A-D).

Transmission Electron Microscopy.

High-angle annular dark-field scanning transmission electron microscopy (HAADF-STEM) is carried out using the aberration-corrected TEAM 0.5 microscope (a modified FEI Titan 80-300) located at the National Center for Electron Microscopy (NCEM). The TEAM 0.5 microscope is operated at 300 kV. The probe semi-convergence angle is set to 16.5 mrad which yields a calculated probe size of 0.63 Å. While a smaller probe size is in principle feasible on the expenses of a reduced depth of field, the chosen setting allows for a sufficiently large depth of field, which enhances the contrast of the atomic columns. The annular semi-detection range of the HAADF detector is about 45-290 mrad. All micrographs shown are unprocessed (see FIG. 6).

Atomic Force Microscopy and Piezo Force Microscopy.

Local piezoelectric properties are studied under ambient conditions using an AFM-based set-up. Measurements are carried out on a Digital Instruments Nanoscope-IV Multimode AFM equipped with a conductive AFM application module, using commercially available TiPt-coated Si tips (MikroMasch). Typical scan rates are 1.5 micron/s. See FIG. 7.

Detailed Piezoresponse Force Microscopy Measurements.

High-resolution PFM measurements are completed on a wide array of samples. Distinct changes in the out-of-plane contrast are observed and little contrast is observed at all in the in-plane contrast. A corresponding plateau is observed to form in the surface morphology upon electric field poling. FIGS. 8-10 show PFM data for the hysteresis measurements shown in FIG. 4.

While the present invention has been described with reference to the specific embodiments thereof, it should be understood by those skilled in the art that various changes may be made and equivalents may be substituted without departing from the true spirit and scope of the invention. In addition, many modifications may be made to adapt a particular situation, material, composition of matter, process, process step or steps, to the objective, spirit and scope of the present invention. All such modifications are intended to be within the scope of the claims appended hereto. All patents, patent applications, and publications mentioned herein are hereby incorporated by reference in their entireties.

What is claimed is:

1. A device comprising a composition comprising a thin film of $BiFeO_3$ (BFO) having a thickness ranging from 20 nm to 300 nm, a first electrode in contact with the $BiFeO_3$ thin film in a tetragonal-like phase, and a second electrode in contact with the $BiFeO_3$ thin film; wherein the first and second electrodes are in electrical communication; wherein the device is configured such that the thin film is capable of a shape change or deformation of up to about 10% of its original dimension.

2. The device of claim 1, wherein the composition is free or essentially free of lead (Pb).

3. The device of claim 1, wherein the thin film is capable of a shape change or deformation of up to about 1.0% of its original dimension.

4. The device of claim 1, wherein the thin film is capable of a shape change or deformation of up to 10 nm.

5. The device of claim 1, wherein the thin film has a thickness ranging from 20 nm to 200 nm.

6. The device of claim 5, wherein the thin film has a thickness ranging from 50 nm to 150 nm.

7. A composition comprising a thin film of $BiFeO_3$ (BFO) having a thickness ranging from 20 nm to 300 nm, a first electrode in contact with the $BiFeO_3$ thin film in a tetragonal-like phase, and a second electrode in contact with the $BiFeO_3$ thin film; wherein the first and second electrodes are in electrical communication; wherein the composition comprises a plurality of pairs of electrodes; wherein the pairs of electrodes are in a series or an array, and each pair of electrode is in electrical communication.

8. The device of claim 1, wherein the device is a piezoelectric transformer, sonar, acoustic sensor, microbalance, strain gauge, vibration sensor, inchworm motor, auto focus motor in a reflex camera, stepping motor, atomic force microscope, scanning tunneling microscope, inkjet printer, or piezoelectric fuel injector in a diesel engine.

9. The device of claim 1, wherein the device is an AFM probe-based data storage system.

10. The device of claim 1, wherein the device is a surface acoustic wave (SAW) device.

11. A method of deforming a $BiFeO_3$ (BFO) thin film comprising: (a) providing a device comprising a composition comprising a thin film of BFO having a thickness ranging from 20 nm to 300 nm, a first electrode in contact with the BFO thin film, and a second electrode in contact with the BFO thin film; wherein the first and second electrodes are in electrical communication, wherein the device is configured such that the thin film is capable of a shape change or deformation of up to about 10% of its original dimension; and (b) creating an electric field through the thin film, such that the thin film is deformed wherein the BFO thin film changes from a tetragonal-like phase into a rhombohedral-like phase.

12. The method of claim 11, wherein the deformation of the thin film is at least 1 nm.

13. The method of claim 12, wherein the deformation is at least 5 nm.

14. The method of claim 13, wherein the deformation is at least 10 nm.

15. The method of claim 11, wherein the electric field is caused by passing a direct electric current through the first and second electrodes via through the thin film.

16. A method of manufacturing a device comprising a piezoelectric composition, comprising: (a) providing a first electrode layer on a substrate, (b) depositing a ferroelectric layer on the first electrode layer, and (c) depositing a second electrode layer on the ferroelectric layer; wherein the ferroelectric layer is a $BiFeO_3$ (BFO) thin film in a tetragonal-like phase; wherein the device is configured such that the thin film is capable of a shape change or deformation of up to about 10% of its original dimension.

17. The method of claim 16, wherein the substrate is Si or an ITO coated glass.

18. The composition of claim 7, wherein the composition is free or essentially free of lead (Pb).

19. The composition of claim 7, wherein the thin film is capable of a shape change or deformation of up to about 1.0% of its original dimension.

20. The composition of claim 7, wherein the thin film is capable of a shape change or deformation of up to 10 nm.

21. The composition of claim 7, wherein the thin film has a thickness ranging from 20 nm to 200 nm.

22. The composition of claim 21, wherein the thin film has a thickness ranging from 50 nm to 150 nm.

23. A device comprising the composition of claim 7.

24. The device of claim 23, wherein the device is a piezoelectric transformer, sonar, acoustic sensor, microbalance, strain gauge, vibration sensor, inchworm motor, auto focus motor in a reflex camera, stepping motor, atomic force microscope, scanning tunneling microscope, inkjet printer, or piezoelectric fuel injector in a diesel engine.

25. The device of claim 24, wherein the device is an AFM probe-based data storage system.

26. The device of claim 25, wherein the device is a surface acoustic wave (SAW) device.

* * * * *